(12) United States Patent
Johnson et al.

(10) Patent No.: US 7,115,520 B2
(45) Date of Patent: Oct. 3, 2006

(54) METHOD AND APPARATUS FOR PROCESS CONTROL IN TIME DIVISION MULTIPLEXED (TDM) ETCH PROCESS

(75) Inventors: David Johnson, Palm Harbor, FL (US); Shouliang Lai, Tampa, FL (US); Russell Westerman, Largo, FL (US)

(73) Assignee: Unaxis USA, Inc., St. Petersburg, FL (US)

( * ) Notice: Subject to any disclaimer, the term of this patent is extended or adjusted under 35 U.S.C. 154(b) by 199 days.

(21) Appl. No.: 10/815,965

(22) Filed: Mar. 31, 2004

(65) Prior Publication Data

US 2004/0235307 A1    Nov. 25, 2004

Related U.S. Application Data

(60) Provisional application No. 60/460,932, filed on Apr. 7, 2003.

(51) Int. Cl.
*H01L 21/461* (2006.01)
*H01L 21/302* (2006.01)
*G05D 7/00* (2006.01)

(52) U.S. Cl. ............... 438/706; 438/714; 137/102
(58) Field of Classification Search ............ None
See application file for complete search history.

(56) References Cited

U.S. PATENT DOCUMENTS

| | | | |
|---|---|---|---|
| 4,253,480 A | 3/1981 | Kessel et al. | |
| 4,579,623 A | 4/1986 | Suzuki et al. | |
| 4,720,807 A * | 1/1988 | Ferran et al. | 700/282 |
| 4,795,529 A | 1/1989 | Kawasaki et al. | |
| 5,501,893 A | 3/1996 | Laermer et al. | |
| 5,758,680 A | 6/1998 | Kaveh et al. | |
| 5,944,049 A | 8/1999 | Beyer et al. | |
| 6,051,053 A | 4/2000 | Noji et al. | |
| 6,119,710 A | 9/2000 | Brown | |
| 6,142,163 A | 11/2000 | McMillin et al. | |
| 6,284,148 B1 | 9/2001 | Laermer et al. | |
| 6,417,013 B1 | 7/2002 | Teixeira et al. | |
| 6,814,096 B1 * | 11/2004 | Vyers et al. | 137/14 |
| 2002/0168467 A1 | 11/2002 | Puech | |

* cited by examiner

*Primary Examiner*—Duy-Vu N. Deo
(74) *Attorney, Agent, or Firm*—Phelps Dunbar LLP; Harvey S. Kauget

(57) ABSTRACT

The present invention provides a method for controlling pressure in a vacuum chamber during a time division multiplexed process. A throttle valve is pre-positioned and held for a predetermined period of time. A process gas is introduced into the vacuum chamber during the associated plasma step (deposition or etching) of the silicon wafer. At the end of the predetermined period of time, the process gas continues to flow with the throttle valve being released from the set position. At this point, the throttle valve is regulated through a proportional derivative and integral control for a period that lasts the remaining time of the associated plasma step.

31 Claims, 12 Drawing Sheets

Pressure Overshoot vs Hold Time

Effects of α on TDM pressure response

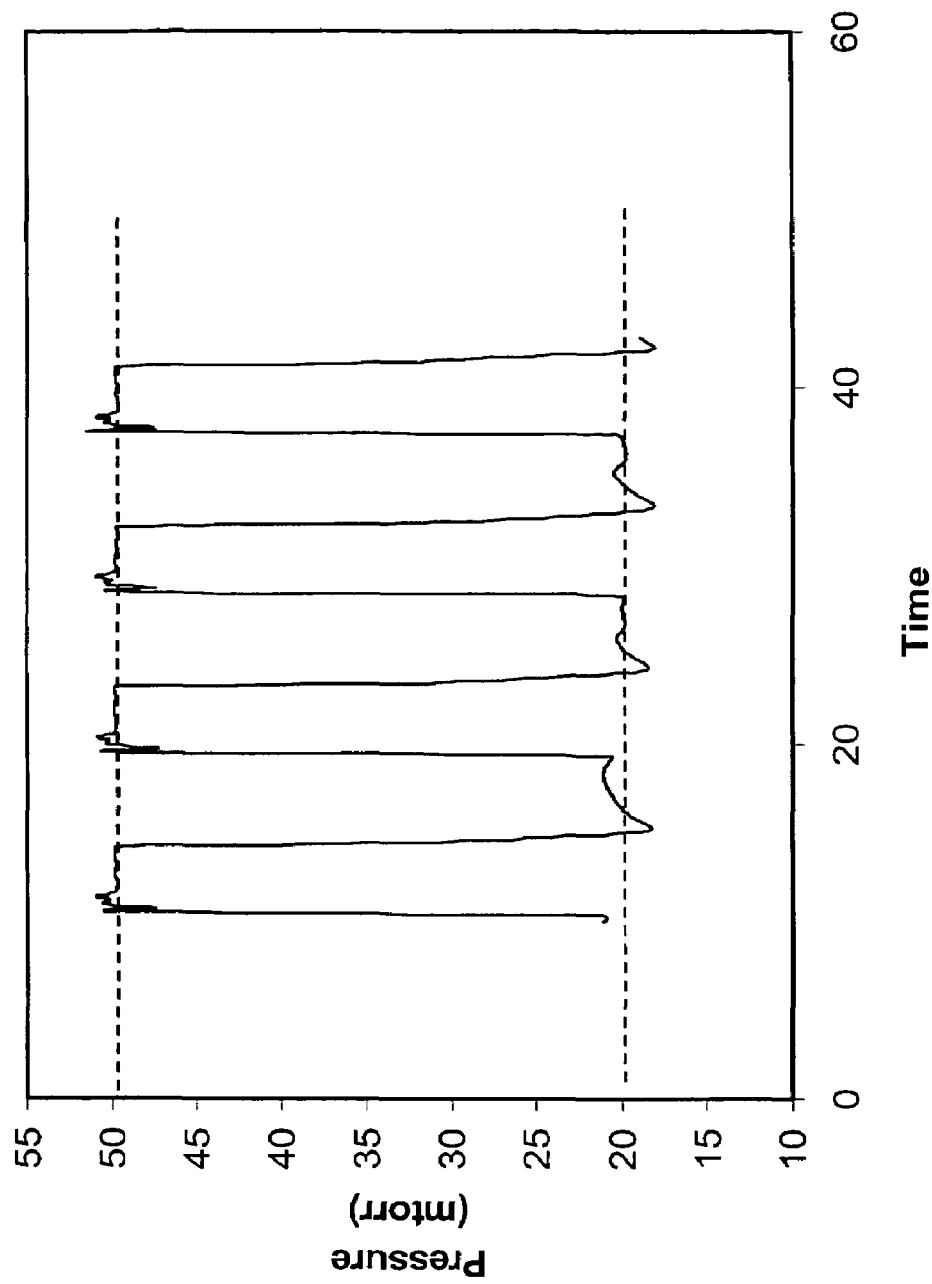

METHOD AND APPARATUS FOR PROCESS CONTROL IN TIME DIVISION MULTIPLEXED (TDM) ETCH PROCESS

CROSS REFERENCES TO RELATED APPLICATIONS

This application claims priority from and is related to commonly owned U.S. Provisional Patent Application Ser. No. 60/460,932, filed Apr. 7, 2003, entitled: A Method and Apparatus for Process Control in Time Division Multiplexed (TDM) Etch Processes, this Provisional Patent Application incorporated by reference herein.

FIELD OF THE INVENTION

The present invention generally relates to the field of semiconductor wafer processing. More particularly, the present invention is directed to a method and apparatus for controlling the reaction chamber pressure during a time division multiplexed etching and deposition process.

BACKGROUND OF THE INVENTION

The fabrication of high aspect ratio features in silicon is used extensively in the manufacture of micro-electro-mechanical (MEMS) devices. Such features frequently have depths ranging from tens to hundreds of micrometers. To ensure manufacturability, the etching processes must operate at high etch rates to maintain reasonable throughputs, along with other performance requirements such as smooth etch profiles.

Conventional, single step, plasma etch processes cannot simultaneously meet these needs, and time division multiplex etch processes have been developed. Time division multiplexed (TDM) approaches for etching silicon have been described by Suzuki et al. (U.S. Pat. No. 4,579,623), Kawasaki et al. (U.S. Pat. No. 4,795,529) and Laermer et al. (U.S. Pat. No. 5,501,893). TDM etch processes typically employ alternating etching and deposition steps. For example, in etching a silicon (Si) substrate, sulfur hexafluoride ($SF_6$) is used as the etch gas and octofluorocyclobutane ($C_4F_8$) as the deposition gas. In an etch step, $SF_6$ facilitates spontaneous and isotropic etching of silicon (Si); in a deposition step, $C_4F_8$ facilitates protective polymer passivation onto the sidewalls as well as the bottom of the etched structures. In the subsequent etching step, upon energetic and directional ion bombardment, the polymer film coated in the bottom of etched structures from the preceding deposition step will be removed to expose the silicon surface for further etching. The polymer film on the sidewall will remain, inhibiting lateral etching. TDM processes cyclically alternate between etch and deposition process steps to enable high aspect ratio structures to be defined into a masked silicon substrate at high etch rates.

In each process step, gases (for example, $SF_6$ and $C_4F_8$) are introduced into the reaction chamber through a gas inlet at flow rates specified in the process recipe. TDM etch process are typically performed in high density plasma reactors (e.g., inductively coupled plasma (ICP), electron cyclotron resonance (ECR), etc.).

TDM process recipes consist of a series of process loop(s) and steps. Each loop consists of two or more process steps controlling the process variables (e.g., gas flow rates, chamber pressure, RF powers, process step times, chamber temperature, wafer temperature, etc.). The steps within a loop are repeated a number of times before executing the next step or loop in the overall process recipe. It is known to make changes to the process step parameters as a loop repeats to improve etch performance, this is known in the art as process morphing (see Teixeira et al. U.S. Pat. No. 6,417,013).

Pressure control is an important component of etching and deposition processes. The flow rate and pressure of the process gases present in the chamber must be carefully controlled to provide the desired deposition and etch characteristics for a repeatable manufacturing process.

A TDM plasma reactor evacuation system typically comprises a turbo pump separated from the reaction chamber by a throttle valve. A pressure controller uses reactor chamber pressure data from a manometer to control a throttle valve. The controller opens or closes the throttle valve to increase or decrease the vacuum supplied from the turbo pump to the reaction chamber. In this manner, the controller maintains the desired pressure in the reaction chamber. During the TDM process chamber pressure set points and gas flow rates cyclically alternate within the process loops. The gas flows can be either single component or mixtures of multiple components. The pressure controller must adjust the throttle valve position to compensate for these changing flow and pressure conditions. Ideally, the pressure controller adjusts the throttle valve position to instantly achieve the pressure set point without pressure set point overshoot or undershoot.

Throttle valves and controllers, currently available, typically operate in either Pressure Control mode or Position Control mode. In the Pressure Control mode the controller monitors the pressure in the reaction chamber and maintains the set point pressure by adjusting the position of the throttle valve (i.e., closed loop pressure control). In position control mode the controller positions the throttle valve to a set point position without monitoring the chamber pressure (i.e., open loop pressure control).

A number of groups have looked at means for process control in plasma chambers. Kessel et al. (U.S. Pat. No. 4,253,480) describes a pressure regulator that employs an adjustable solenoid valve to control pressure. Kessel teaches the fundamental mechanism dictating the operations of many throttle valves used in vacuum chambers. The actual pressure in a container is measured and converted to electrical signals. A comparator generates a regulation signal that represents the difference between the actual pressure and a command pressure. A regulator uses the regulation signal to direct the valve in such a manner that the valve member is adjustable between intermediate positions within a range between the open and closed positions of the valve. In fact, the throttle valves used in TDM process tools are operated following such principles. However, as described earlier, the inability to control pressure during the transition of the constantly alternating TDM process steps is the real issue, and cannot be addressed by Kessel's technique.

Kaveh et al. (U.S. Pat. No. 5,758,680) and McMillin et al. (U.S. Pat. No. 6,142,163) describe the use of a ballast port for inserting gas into the evacuation system to compensate the pressure fluctuations in the reaction chamber so as to minimize throttle valve movement between different process steps. They further disclose a method to reduce the time for gas stabilization in a vacuum chamber. A throttle valve is first pre-positioned to the desired position. The desired position is estimated using pre-determined estimation curves. Then for a specified period of time, proportional and derivative (PD) control is enabled to control throttle valve movement. Then proportional, integral and derivative (PID) control is enabled to regulate throttle valve movement. The examples taught in the disclosure show that the time period for pressure stabilization is reduced from ~20 seconds to at least 3–5 seconds. While Kaveh and McMillin contemplate the change of gas flow rates and pressures when process steps change from one to the next, the use in cyclical and alternating TDM processes is not taught. Additionally, many TDM processes employ alternating process steps which last only a few seconds or shorter, which makes pressure control impractical using the disclosed technique.

Brown et al. (U.S. Pat. No. 6,119,710) describes the use of adjustable gas flow into the reaction chamber to compensate the pressure variations in the chamber. However, in many TDM processes, changing process gas flow rate during a process step is undesirable.

Beyer et al. (U.S. Pat. No. 5,944,049) describes regulating chamber pressure by controlling either the exhaust pressure at the exhaust side of a vacuum pump or the internal pressure at a compression stage of the first vacuum pump. Adjustments on vacuum pumping speed or injection of inert gas into the exhaust side or the compression stage of a vacuum pump are used to control reaction chamber pressure. Beyer does not teach how to use this technique in TDM processes.

Puech (U.S. patent application Ser. No. 20020168467) describes a way to control pressure by injecting passive control gas at a complementary flow rate into an area near the evacuation port. The flow rate of the controlled passive gas is regulated so as to maintain the total gas flow into the vacuum enclosure at a substantially constant rate. While Puech teaches the control of pressure in the TDM processes that employ process steps on the order of one second, the method does not teach the use of actively regulating throttle valve in pressure control.

The current methods of pressure control for TDM processes, Pressure Control and Position Control, have limitations. One problem with pressure control mode in a TDM process is that, in practice, there is typically a trade off between achieving fast pressure response time while minimizing set point deviations. Fast response times are possible at the expense of a period of pressure set point overshoot. Optimizing available Pressure Control mode algorithms to minimize set point overshoot results in slow response times. As the TDM step durations decrease, the time spent trying to reach the recipe specified set point becomes a significant fraction of the processing time.

A problem with the current method of Position Control mode in a TDM process is unacceptably long pressure response times. While position mode minimizes process overshoot, the slower response times result in the chamber pressure spending a large fraction of the process time approaching the requested set point value (i.e., out of compliance with the recipe specified set point).

Another problem with the position control mode method is that it is an open loop pressure control algorithm. Therefore, there is not any correction for perturbations in gas flow or pumping efficiency. These perturbations tend to cause the process pressure, and subsequent process performance, to vary with time.

Therefore, there is a need for a pressure control means for TDM processes, preferably for those processes that employ process steps that are a few seconds or less in duration.

Nothing in the prior art provides the benefits attendant with the present invention.

Therefore, it is an object of the present invention to provide an improvement which overcomes the inadequacies of the prior art devices and which is a significant contribution to the advancement of the semiconductor processing art.

Another object of the present invention is to provide a method for anisotropically etching a feature in a substrate comprising the steps of: subjecting the substrate to an alternating cyclical process within a plasma chamber, said alternating cyclical process having an etching step and a deposition step; introducing into said plasma chamber a first process gas for depositing a film onto the substrate during the deposition step of said alternating cyclical process; introducing into said plasma chamber a second process gas for etching the substrate during the etching step of said alternating cyclical process; regulating pressure of said plasma chamber by setting a throttle valve at a predetermined position set point for a predetermined period of time during at least one step of said alternating cyclical process; igniting a plasma for a recipe period of time for the deposition step of said alternating cyclical process and the etching step of said alternating cyclical process; enabling a closed loop pressure control algorithm after said predetermined period of time expires; and controlling pressure at a recipe specified pressure set point in said plasma chamber through a closed loop pressure control for a period that lasts the remaining time of the step.

Yet another object of the present invention is to provide a method of pressure control in a time division multiplex process comprising the steps of: regulating a process pressure in a vacuum chamber in at least one step of the time division multiplex process by setting a throttle valve at a predetermined position set point for a predetermined period of time; introducing into said vacuum chamber at least one process gas; enabling a closed loop pressure control algorithm after said predetermined period of time expires; and controlling pressure at a recipe specified pressure set point through a closed loop pressure control for a period that lasts the remaining time of said step of the time division multiplex process.

Still yet another object of the present invention is to provide a method for controlling pressure in a vacuum chamber, the method comprising the steps of: regulating a process pressure in the vacuum chamber by setting a throttle valve at a predetermined position set point for a predetermined period of time; introducing into said vacuum chamber a gas; enabling a closed loop pressure control algorithm after said predetermined period of time expires; and controlling pressure at a recipe specified pressure set point in said vacuum chamber through a closed loop pressure control.

The foregoing has outlined some of the pertinent objects of the present invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

For the purpose of summarizing this invention, this invention comprises a method and an apparatus for controlling the pressure in a vacuum chamber during a TDM process.

A feature of the present invention is to provide a method for anisotropically etching a feature in a substrate. The method comprising the following steps. The substrate is placed within a plasma chamber and subjected to an alternating cyclical process having an etching step and a deposition step. The pressure of the plasma chamber is regulated by setting a throttle valve at a predetermined position set point for a predetermined period of time to ensure that the chamber pressure does not overshoot or undershoot the desired operating level while minimizing the time required to reach the set point value. A first process gas, such as octofluorocyclobutane, is introduced into the plasma chamber for depositing a film onto the substrate during the deposition step of the alternating cyclical process. A plasma is ignited for a recipe period of time for the deposition step of the alternating cyclical process. A closed loop pressure control algorithm is enabled after the predetermined period of time expires. Then, the pressure of the plasma chamber is controlled at a recipe specified pressure set point through a closed loop pressure control for the remaining time of the deposition step. Next, the pressure of the plasma chamber is again regulated by setting the throttle valve at a predetermined position set point for a predetermined period of time to ensure that the chamber pressure does not overshoot or undershoot the desired operating level while minimizing the time required to reach the set point value. A second process gas, such as sulfur hexafluoride is introduced into the plasma chamber for etching the substrate during the etching step of the alternating cyclical process. A plasma is ignited for a recipe period of time for the etching step of the alternating cyclical process. A closed loop pressure control algorithm is enabled after the predetermined period of time expires. Then, the pressure of the plasma chamber is controlled at a recipe specified pressure set point through a closed loop pressure control for the remaining time of the etching step.

The predetermined position set point can either be set or derived from the following:

1. A throttle valve position of a preceding like step of the alternating cyclical process;

2. An average valve position of a plurality of preceding like steps of the alternating cyclical process; or 3. Prior calibration experiments.

The predetermined position set point can be adjusted by an offset from about 0.5 to 2 of the throttle valve position of the preceding like step of the alternating cyclical process. The predetermined position set point can change using a predefined function for the duration of the predetermined period of time. The predetermined position set point can be modified based on pressure performance of a preceding like step of the alternating cyclical process such as minimizing the time to reach the recipe specified pressure set point or minimizing the deviation from the recipe specified pressure set point.

The predetermined period of time is about 0.05 to 0.5 seconds long. The predetermined period of time can be modified based on pressure performance of a preceding like step of the alternating cyclical process such as minimizing the time to reach the recipe specified pressure set point or minimizing the deviation from the recipe specified pressure set point.

Yet another feature of the present invention is to provide a method of pressure control in a time division multiplex process. The method comprising the following steps. The process pressure in a vacuum chamber is regulated in at least one step of the time division multiplex process by setting a throttle valve at a predetermined position set point for a predetermined period of time to ensure that the chamber pressure does not overshoot or undershoot the desired operating level while minimizing the time required to reach the set point value. At least one process gas is introduced into the vacuum chamber for processing a substrate according to the time division multiplex process. A closed loop pressure control algorithm is enabled after the predetermined period of time expires. Then, the pressure of the vacuum chamber is controlled at a recipe specified pressure set point through a closed loop pressure control for a period that lasts the remaining time of the processing step of the time division multiplex process.

Still yet another feature of the present invention is to provide a method for controlling pressure in a vacuum chamber. The method comprising the following steps. The process pressure of the vacuum chamber is regulated by setting a throttle valve at a predetermined position set point for a predetermined period of time to ensure that the chamber pressure does not overshoot or undershoot the desired operating level while minimizing the time required to reach the set point value. A gas is introduced into the vacuum chamber. A closed loop pressure control algorithm is enabled after the predetermined period of time expires. Then, the pressure is controlled at a recipe specified pressure set point in the vacuum chamber through a closed loop pressure control.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

FIG. 11 is a graph of pressure versus time for experimental examples when the process control method of the present invention is implemented where etch hold times are held at 0.25 seconds and deposition hold times are held at 0.40 seconds with a constant position offset for the etch step of α=0.88 and a constant position offset for the deposition step of β=1.25.

Similar reference characters refer to similar parts throughout the several views of the drawings.

DETAILED DESCRIPTION OF THE INVENTION

We disclose a means of controlling pressure in a TDM, or any alternating step process, through a "Hold and Release" method. A throttle valve is pre-positioned when a process step is switched to the next process step. A control system is implemented to automatically set the position value at which the throttle valve is pre-positioned. The set position is derived from the throttle valve position in the preceding process steps of the same type. For a pre-determined period of time the throttle valve is held at the set position. After the holding period, the throttle valve is released, and a closed loop feedback control algorithm (e.g., PID loop) is enabled for the throttle valve to regulate the pressure in a vacuum chamber in the pressure control mode. The control system and method are disclosed.

Figure 1:
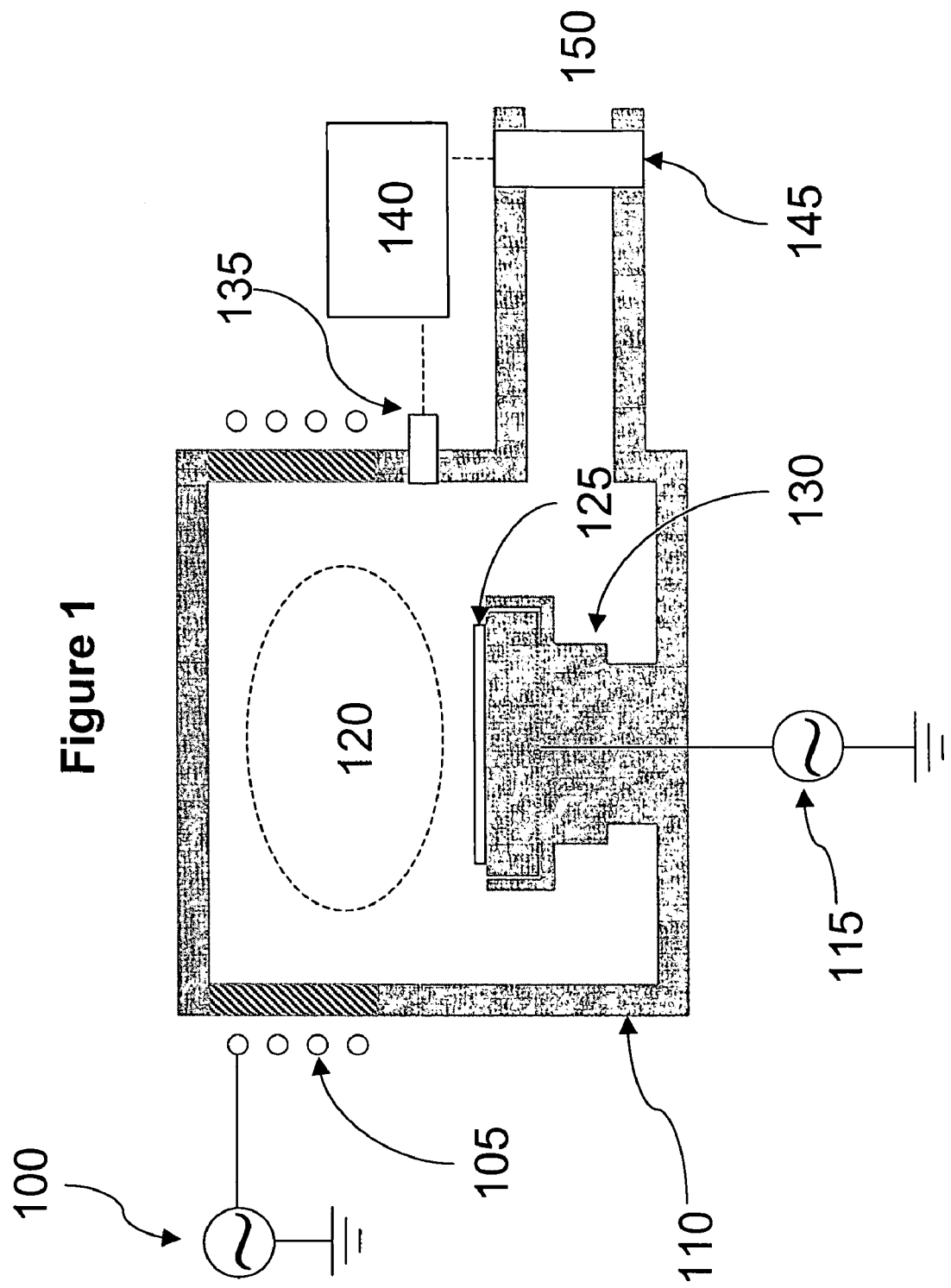
FIG. 1 is a side view showing the major assemblies of a plasma processing machine.

A plasma etching system according to the present invention is shown in FIG. 1. In an ICP reactor, a RF generator 100 delivers power to a coil 105 in the upper part of a reaction chamber 110. This power is transmitted into one or more process gases that are introduced through a gas inlet (not shown) in order to ionize the process gas or gases and form a plasma 120. A second RF generator 115 delivers power to a wafer support 130 so as to induce a DC bias on a wafer 125, thereby controlling the direction and energy of ion bombardment to the surface of the wafer 125. An evacuation system continuously removes the gaseous species (i.e., unreacted gases, volatile by-products, etc.) from the reaction chamber 110 through an exhaust manifold 150. The pressure in the reaction chamber 110 is regulated through a throttle valve 145. The throttle valve 145 is operated by a throttle valve controller 140. The reaction chamber 110 pressure is measured by a manometer 135. The output signal of the manometer 135 is fed as an input to the throttle valve controller 140.

Figure 2:
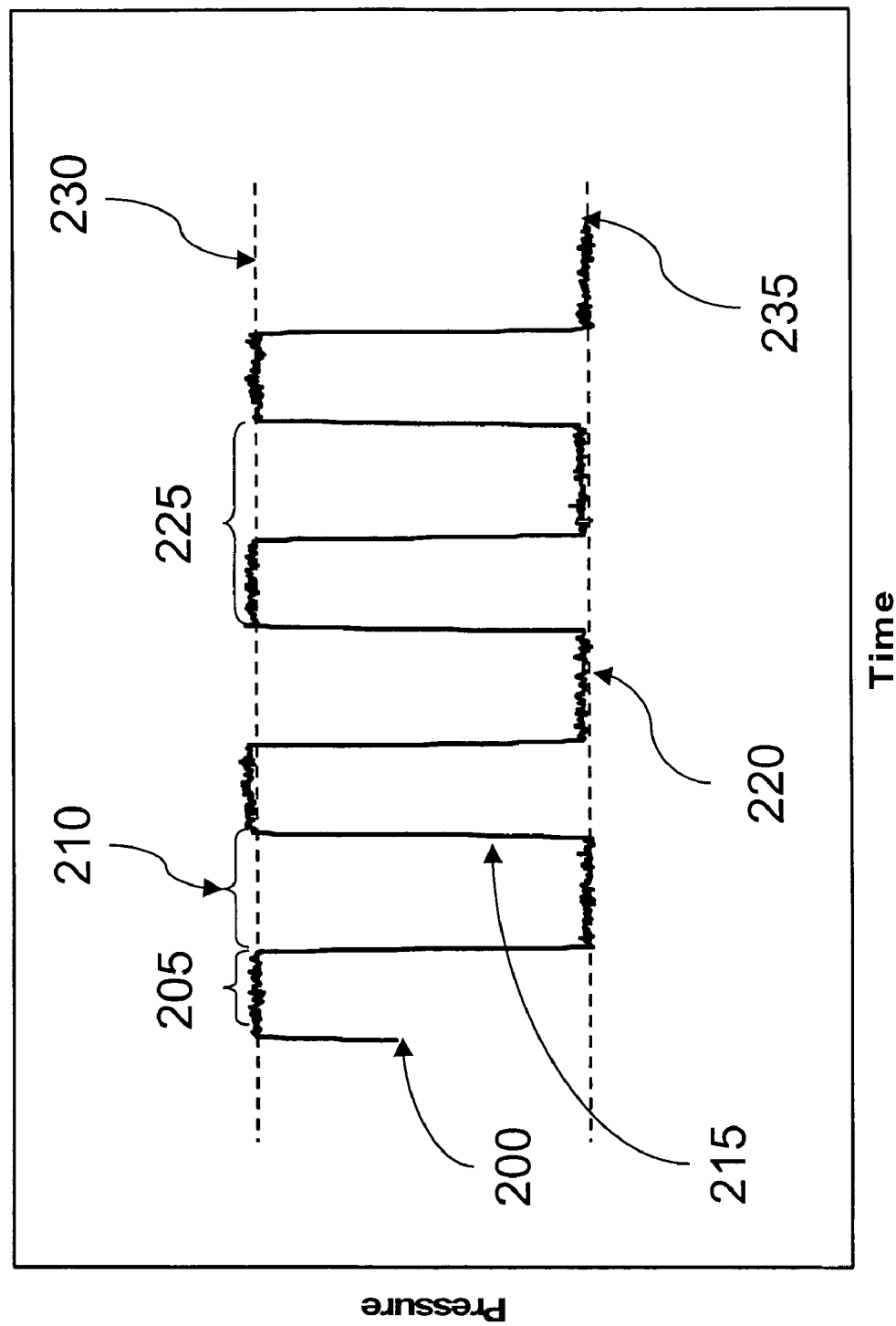
FIG. 2 is a graph of the desired pressure versus time response for a two step TDM process operated in pressure control mode.

FIG. 2 illustrates the desired pressure response 200 of multiple loops 225 for a two step TDM process. The pressure set point 230 for the first step 205 requires a different throttle valve position than the pressure set point 235 for the second step 210. A quick pressure response is desired in a TDM process due to the rapid rise time 215 between steps in conjunction with minimal deviation from set point 220 during the process steps.

Figure 3:
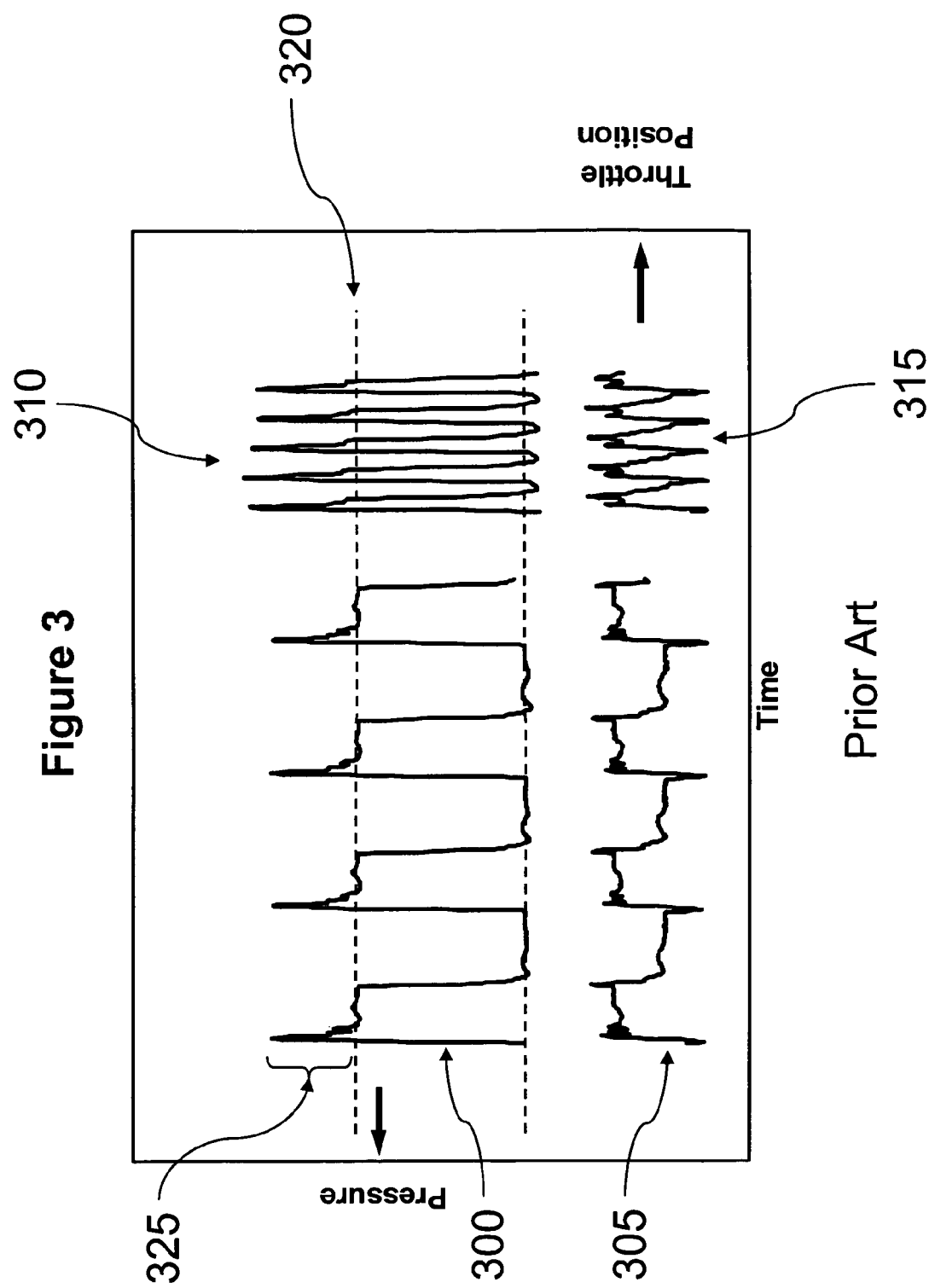
FIG. 3 is a graph of the prior art pressure versus time response for a two step TDM process operated in a pressure control mode.

FIG. 3 graphically illustrates a prior art solution with the throttle valve controller in pressure control mode. This figure shows a plot of pressure response 300 versus time with a corresponding throttle valve position 305 for a two step TDM process. During a TDM process, this control method results in pressure overshoot 325 from the recipe specified set point 320. The pressure control performance degrades further as the TDM step 310 duration decreases. In addition, the corresponding throttle valve position 315 never realizes a steady state position.

Figure 4:
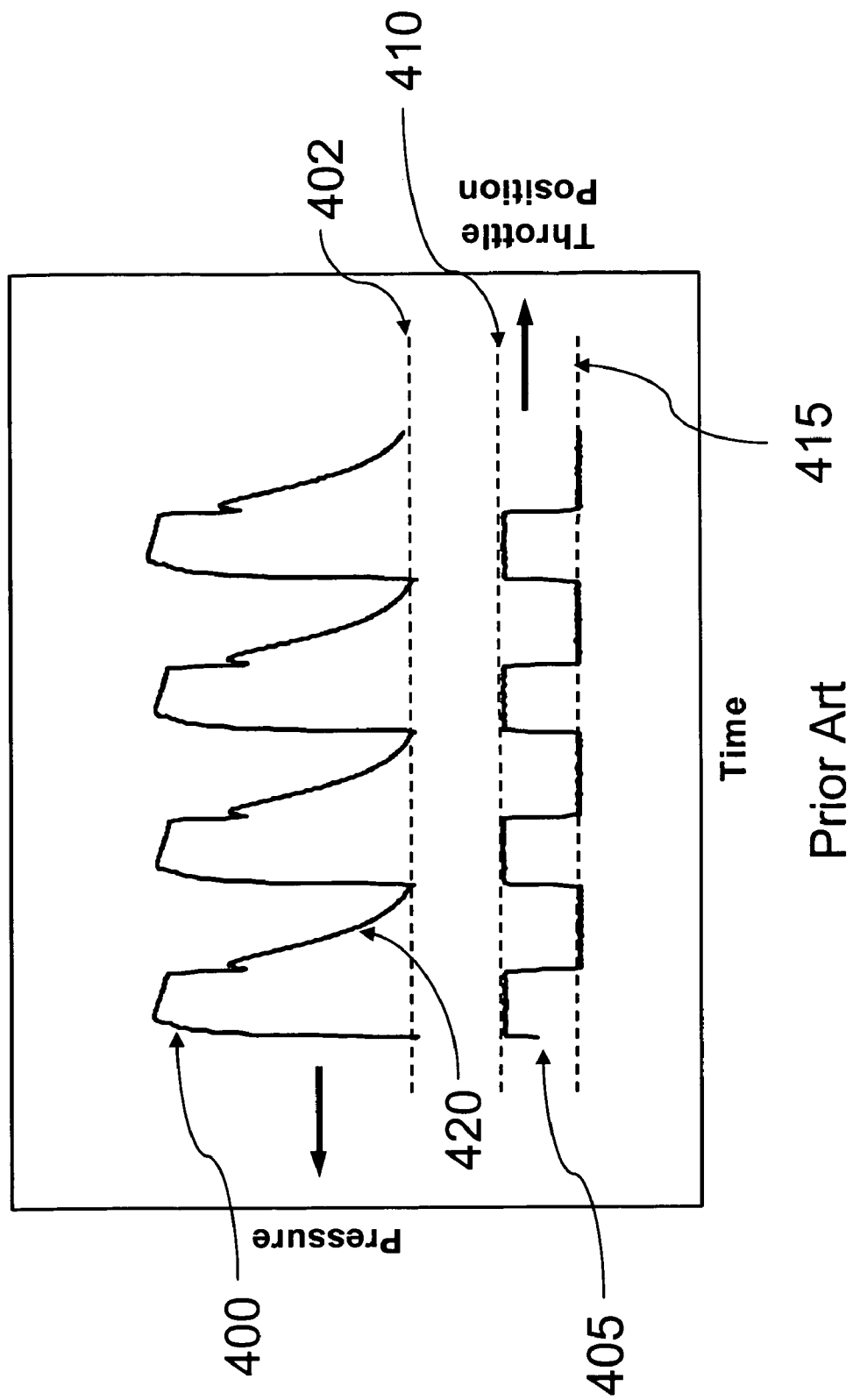
FIG. 4 is a graph of the prior art pressure versus time response for a TDM process operated in position control mode.

FIG. 4 graphically illustrates an alternative prior art solution with the throttle valve controller in position control mode. This figure shows a plot of pressure response 400 versus time with a corresponding throttle valve position 405 for a two step TDM process. This control method uses throttle valve position set points 410 & 415 to drive the throttle valve to set positions during the TDM process. In this example, a delay in pressure response 420 relative to position set point change is noticed and the desired pressure 402 is never achieved.

Figure 5:
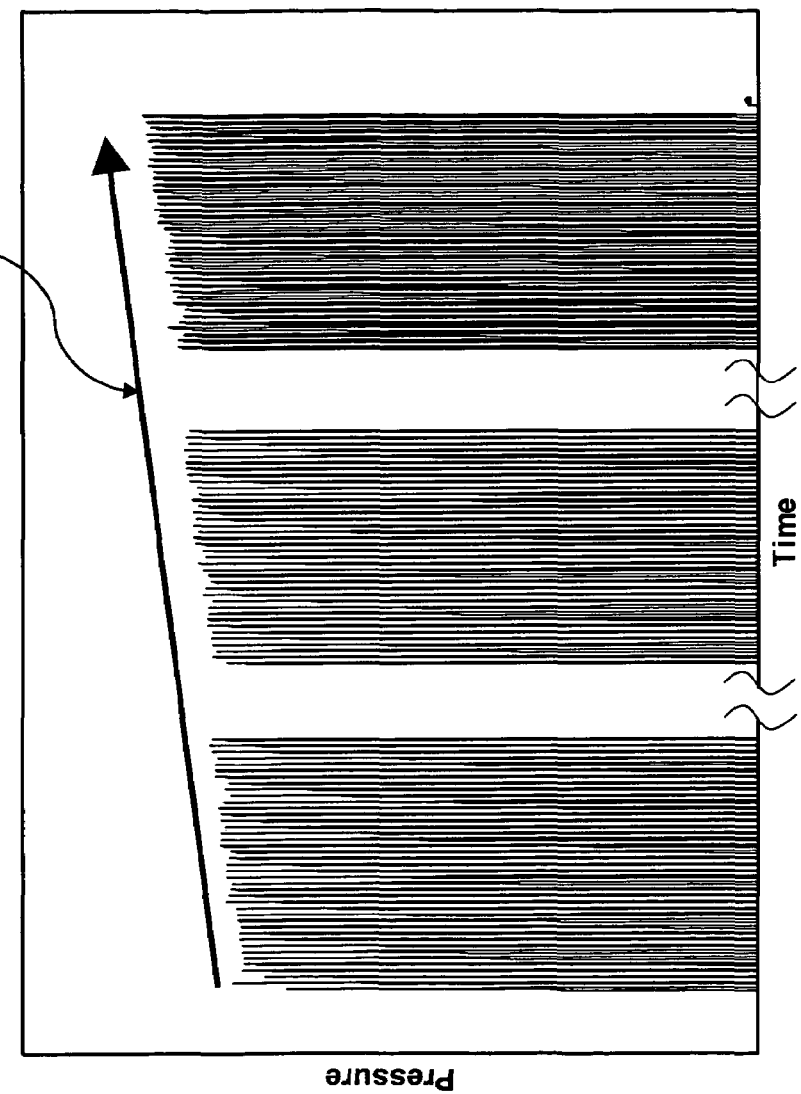
FIG. 5 is a graph of the prior art pressure versus time response for a TDM process operated in position control mode over longer time scales.

FIG. 5 graphically illustrates yet another problem encountered when position control mode is used to control reaction chamber pressure. This figure shows a plot of pressure response versus time for a two step TDM process with a fixed throttle valve position using two different gas flows in the corresponding steps. Pressure drift 500 over a long process run (100's of iterations) is observed. This pressure drift 500 may be due to the temperature increase in the reaction chamber wall. Consequently, additional measures must be taken in order to maintain process performance reliability and repeatability.

Figure 6:
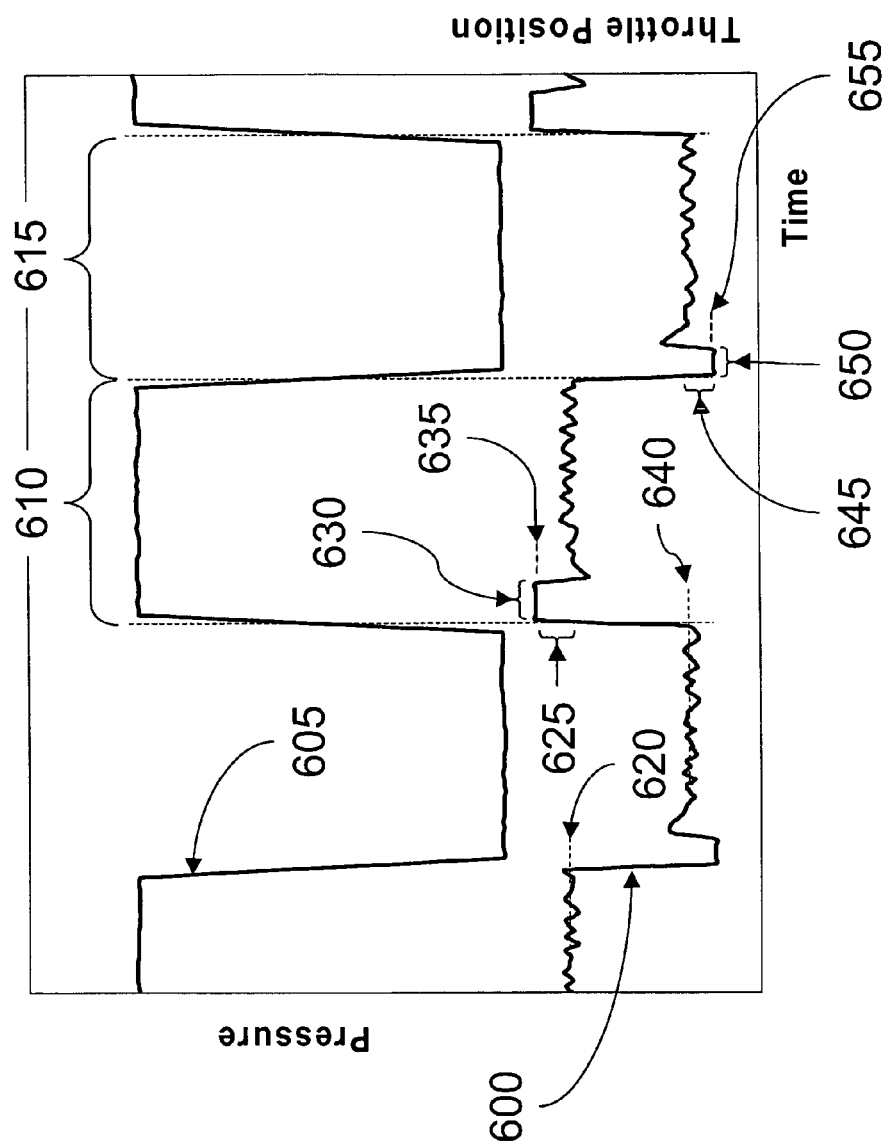
FIG. 6 is a graph explaining the control system of an embodiment of the present invention.

FIG. 6 shows a graph of a pressure response 605 versus time with a corresponding throttle valve position 600 for a two step TDM process. As demonstrated earlier, pressure control during the transition between process steps has proven to be difficult as pressure overshoot may occur. According to one embodiment of the present invention, position control mode is applied in the first segment 630 of a step 610. The throttle valve is pre-positioned and held at a set position 635 that is derived from the throttle valve position 620 from the previous execution of the step. After the first segment 630, the throttle valve is released from the position control mode. At that point a closed loop feed back control algorithm is enabled so that pressure control mode is applied for the remainder of the step 610.

After the step 610 is completed, the process step is switched to a next step 615. During the first segment 650 of this step 615 the throttle valve is switched to position mode. The throttle valve is held at another set position 655 that is derived from the known throttle valve position 640 of the previous execution of that step. Position control mode is applied for a set period 650 and the throttle valve is held at the set position 655 for this entire period. After the holding period 650 is expired, the throttle valve is released and a pressure control mode is applied for the remainder of the step 615 by enabling a closed loop pressure feedback control algorithm for the throttle valve. Alternatively, in the step described above, the throttle valve can be pre-positioned at a position that is derived from the average value of the throttle valve position measured in a number of previous steps of the same kind. This has the advantage of smoothing out step to step variations.

In many TDM processes, it is beneficial to assign different time lengths for the holding periods 630, 650 (see FIG. 6). It is also beneficial to adjust the pre-positions 635, 655 flexibly—not just taking the throttle valve's last position from the previous process steps. According to another embodiment of the invention, the holding periods in the deposition step and the etch step are independently determined, and the pre-position values for the throttle valve in the holding periods are independently adjusted. One method of deriving an adjusted value for the pre-positions 635, 655 is to apply a multiplier to the throttle valve's last position from the previous execution of that step. As shown in FIG. 6, this multiplier will result in an offset 625, 645 of the pre-position values 635, 655 from the previous step value position 620, 640. In this manner, the pre-positioned throttle valve position can be offset either greater than or less than the position from the previous step.

Figure 7A:
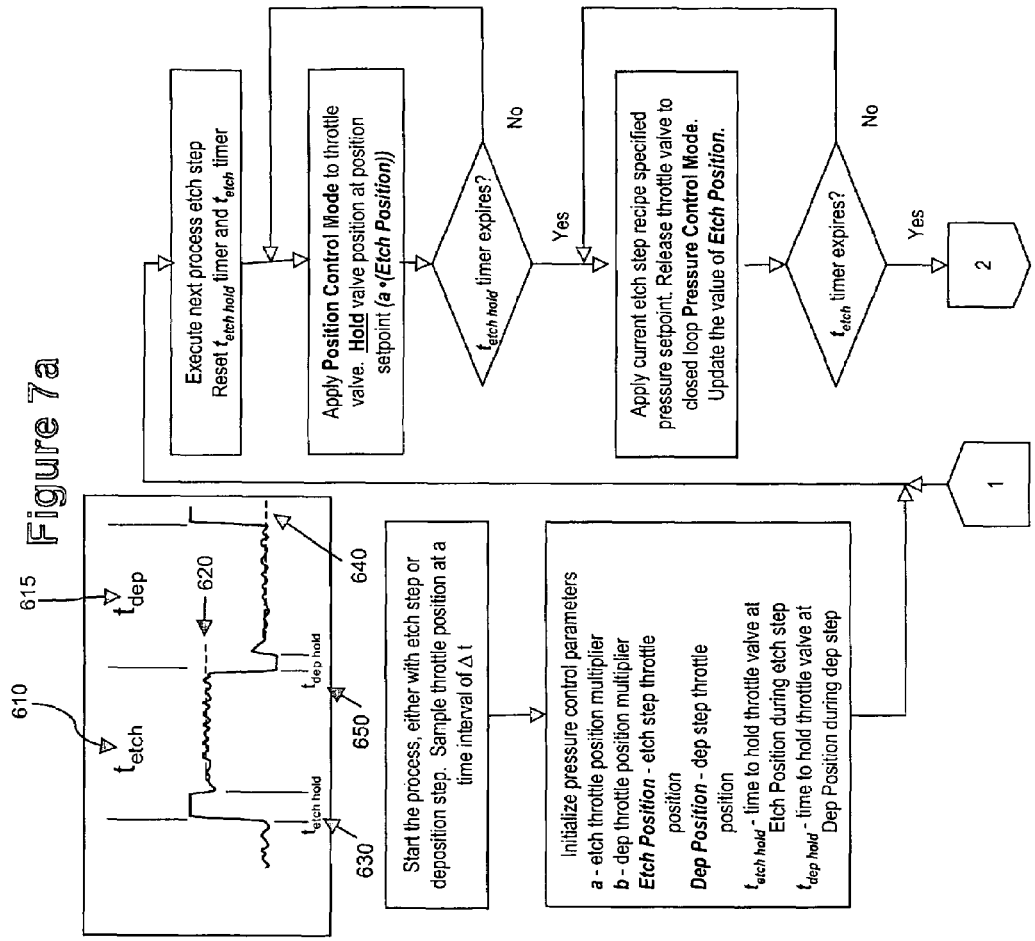
FIG. 7a is a block diagram explaining the control system of an embodiment of the present invention.
Figure 7B:
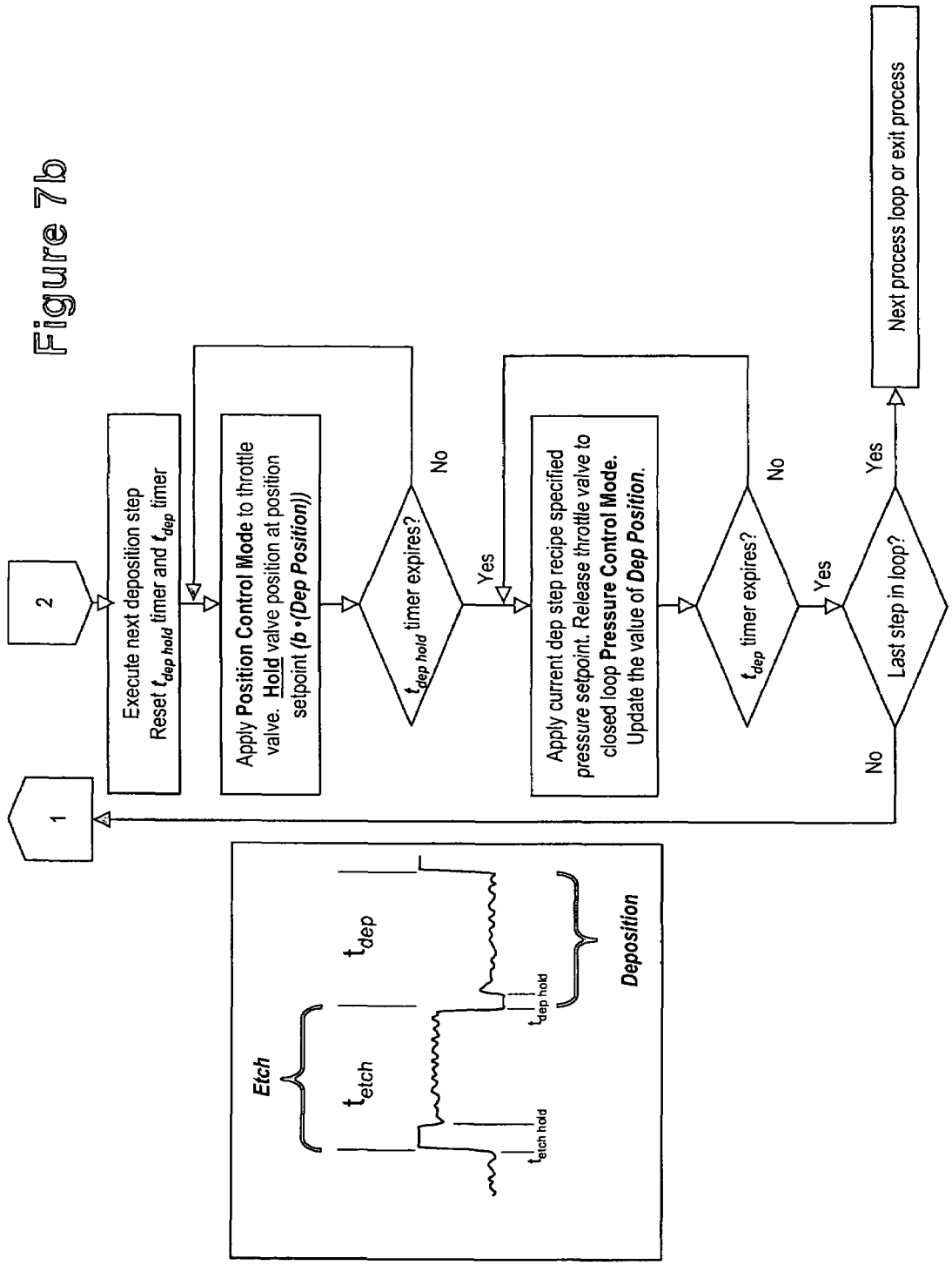
FIG. 7b is a continuation of the block diagram of FIG. 7a explaining the control system of an embodiment of the present invention.

A block diagram illustration for this embodiment is shown in FIGS. 7a and 7b for a two-step TDM silicon etch process. In FIG. 7a, the holding period is denoted as "$t_{etch\ hold}$" 630 and as "$t_{dep\ hold}$" 650. The step time periods are denoted as "$t_{etch}$" 610 and as "$t_{dep}$" 615. These time lengths can be part of the process recipe at the beginning of the execution of the process. Further more, the throttle valve position from the previous step is denoted as "Etch Position" 620 and as "Dep Position" 640. The pre-position for holding the throttle valve in the etch period 630 is taken from a preceding etch step and adjusted by a factor of α. Likewise, the pre-position for holding the throttle valve in the deposition period 650 is taken from a preceding deposition step and adjusted by a factor of β. The values of α and β can be set manually in the process recipe or automatically by a feedback control loop (e.g., PID) that measures the pressure and uses that information to adjust the pre-position value to minimize overshoot and minimize the time to reach setpoint as the process proceeds. The parameters α and β typically have a value between 0.5 and 2.0 which translate to 50 percent to 200 percent of the prior position. For example, in the case where α and β are set to 1.0, the invention will use the throttle valve position value 620 from the previous execution of the etch step as the pre-position value during the etch hold period.

It will be obvious to one skilled in the art that the pressure control scheme need not be applied to all steps within a TDM process loop. Setting the values of the etch hold length period 630 to zero allows the method to revert to the prior art method of closed loop pressure feedback control. Similarly, in the case where α and β are set to unity and the length of the etch hold period 630 is set to the etch step time 610 allowing the method to revert to the prior art method of position control mode (open loop pressure control mode).

PRESSURE CONTROL EXAMPLES

For any step in a TDM process using the current invention, two parameters need to be specified for the throttle valve; i.e., the duration of the hold time, and the magnitude of the offset.

Figure 8:
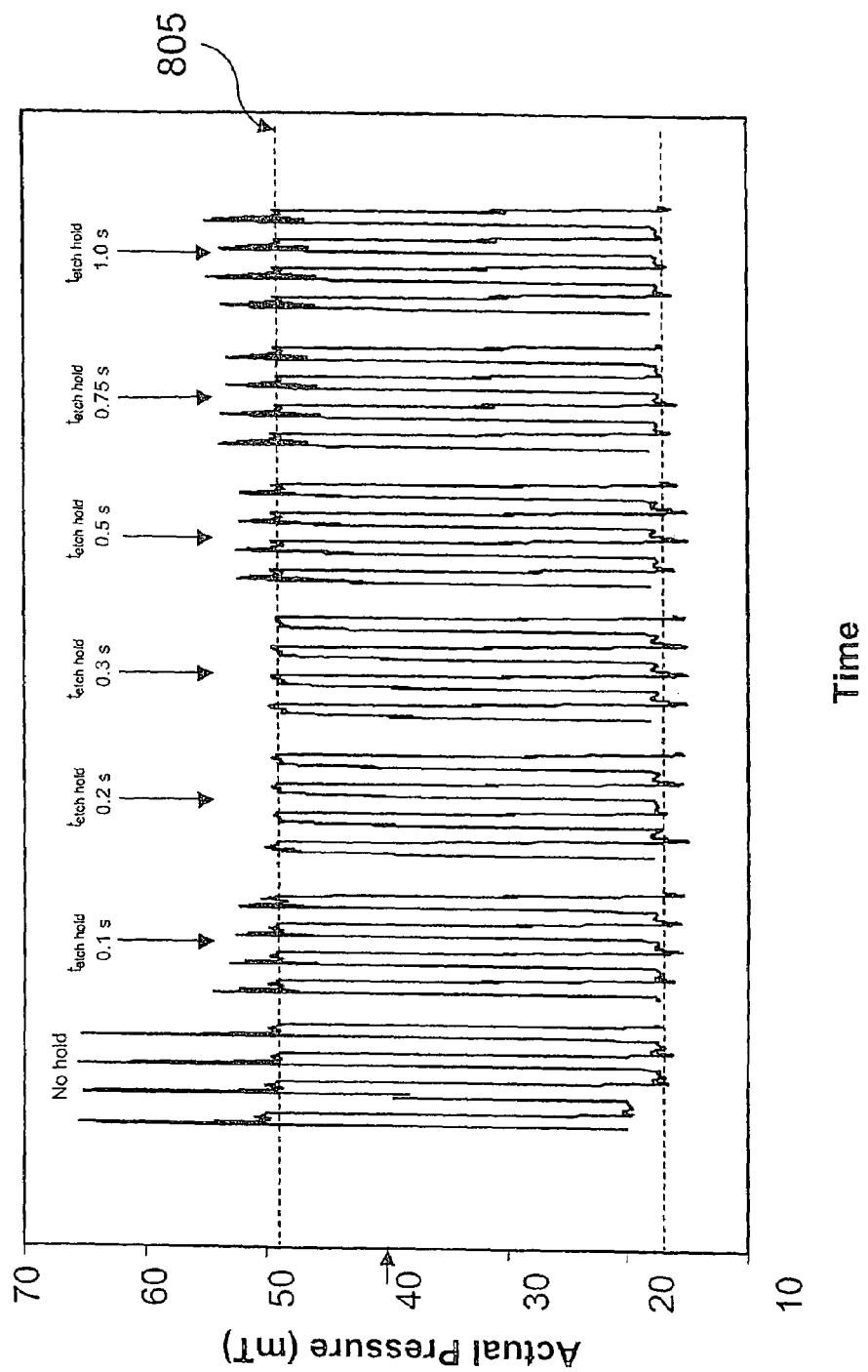
FIG. 8 is a graph of pressure versus time for experimental examples when the process control method of the present invention is implemented for various input values.

FIG. 8 graphically exhibits experimental examples when the process control method of the present invention is implemented. The effect of various length of etch holding periods are displayed. As can be seen, if the etch holding period is less than about 0.1 seconds long, the pressure overshoot occurs during the deposition-to-etch transition. If the holding period is about 0.2 to 0.3 seconds long the overshoot is nearly eliminated and the deviation from the pressure set point 805 is minimized. As the etch holding time gets longer, the pressure overshoot reappears in the scope of the experiment. This result demonstrates that the hold and release method of the present invention indeed improves pressure control capability significantly.

Figure 9:
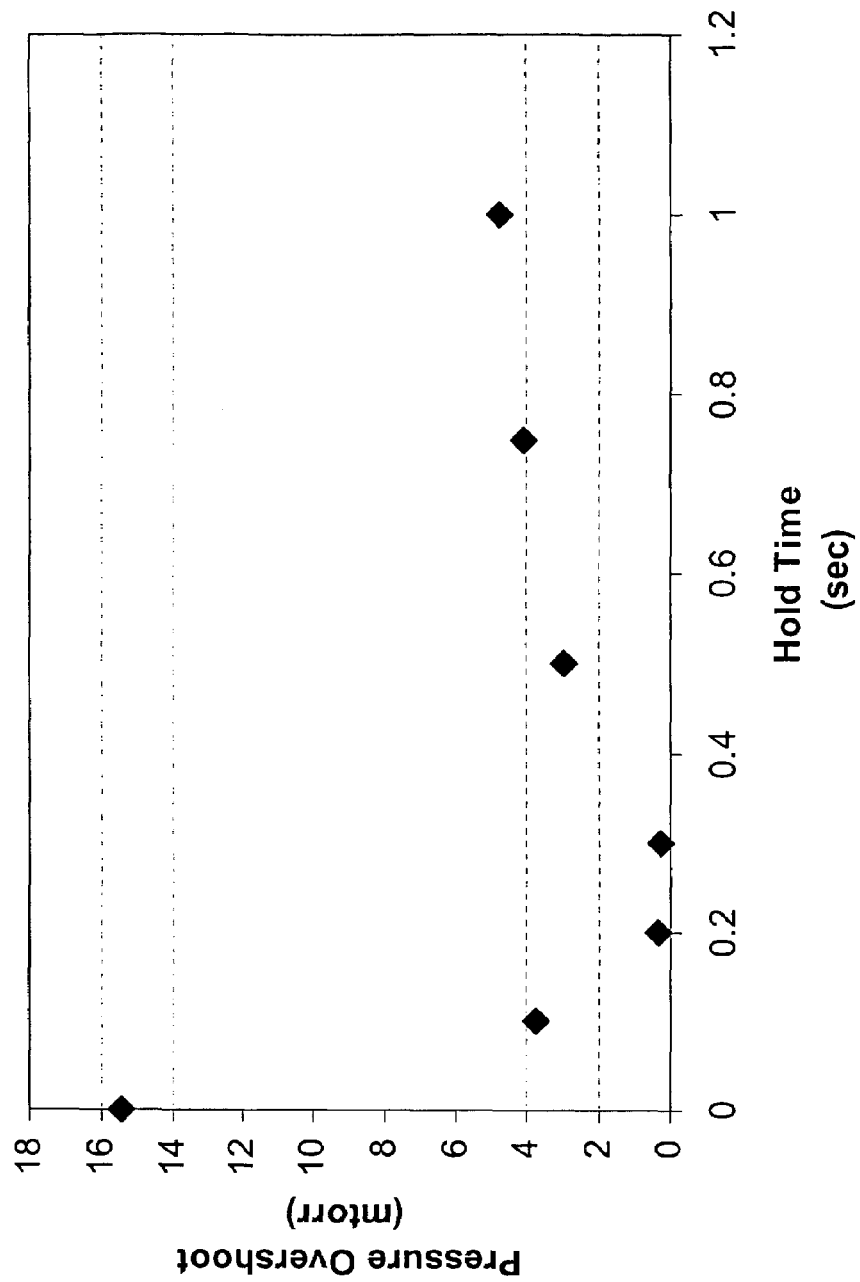
FIG. 9 is a graph showing optimization of one of the input values of the present invention.

In another embodiment of the invention, the pre-position hold time can be automatically adjusted as the process proceeds to minimize set point overshoot. FIG. 9 graphs the pressure set point overshoot versus the pre-position hold time from the data of FIG. 8 for a two step TDM silicon etch process. A feedback control loop (e.g., PID) that measures the pressure overshoot uses that information to adjust the pre-position hold time to minimize overshoot as the process proceeds. Likewise a feedback control loop (e.g., PID) that measures the time to reach setpoint can use that information to adjust the pre-position hold time so that the time to reach setpoint is minimized as the process proceeds.

Figure 10:
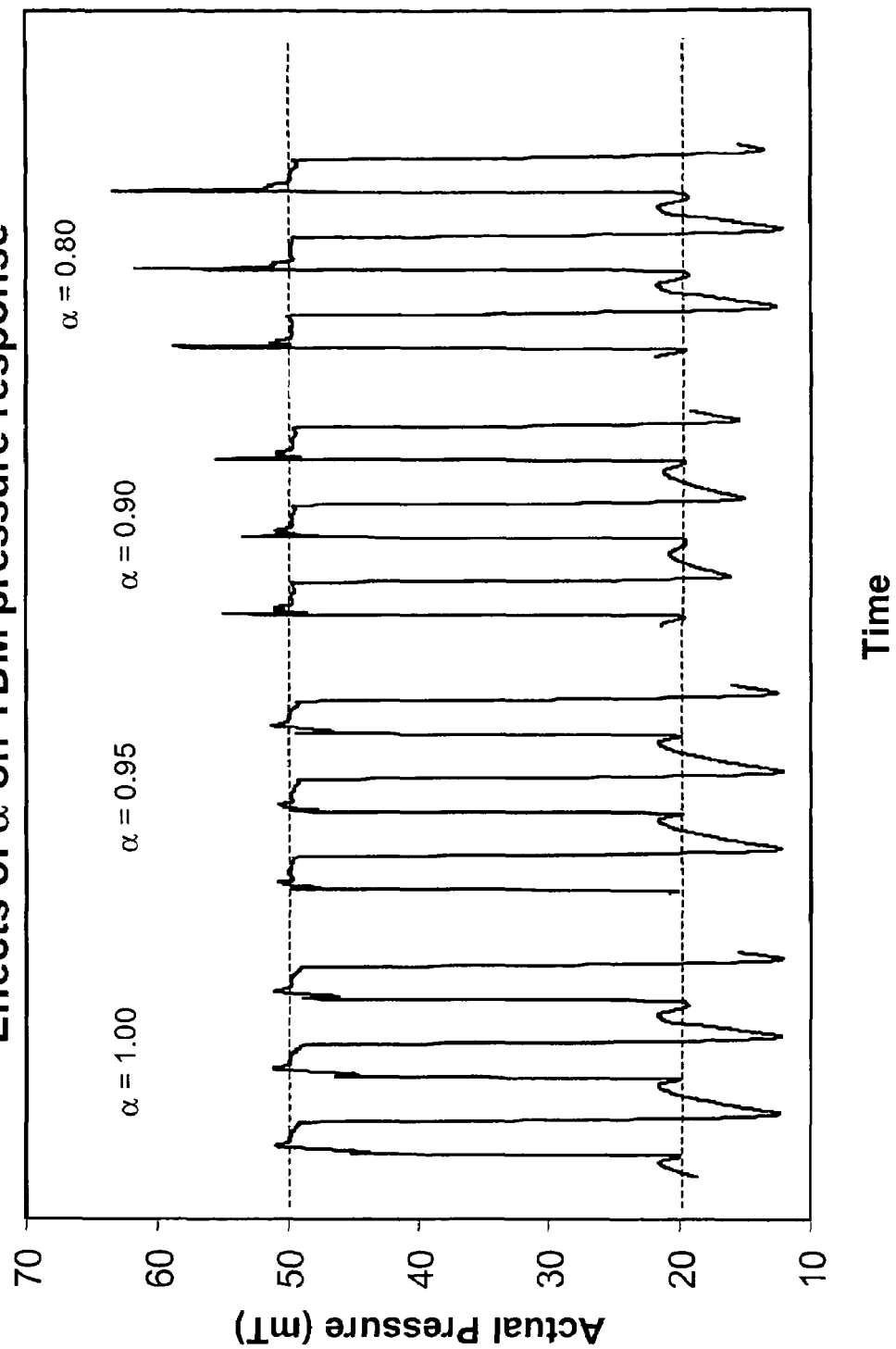
FIG. 10 is a graph of pressure versus time for experimental examples when the process control method of the present invention is implemented for various input values.

FIG. 10 graphically exhibits experimental examples when the process control method of the present invention is implemented. The effect of various values of pre-positioning offsets for a fixed duration are displayed. At a negative 5% etch hold position adjust (α=0.95) the pressure overshoot is minimized. This result demonstrates that the hold and release method of the present invention indeed improves pressure control capability significantly.

It will be apparent to one skilled in the art that the described embodiments can be applied to multi-step looping processes that contain two or more process steps per loop. The invention can also be applied to looped processes where the pressure set-point or other recipe specified step parameters are changed within a loop during the course of the process, (e.g., morphed TDM processes).

It is important to note that the invention does not require a hold time and position offset for each step type within the alternating process. Another embodiment of the invention would include introducing a position hold time for at least one of the step types within a TDM process.

FIG. 11 graphically presents an example in which optimized control of pressure in a two step TDM silicon etch process is attempted. In FIG. 11, "$t_{etch\ hold}$" is 0.25 seconds, "$t_{dep\ hold}$" is 0.4 seconds, α=0.88 and β=1.25. Compared with previous examples (see FIGS. 3, 4 and 5), the resultant pressure profile during the cyclical TDM process operation is significantly improved as it is nearly "squared". The pressure approaches the set point values more rapidly and pressure overshoot and undershoot are almost eliminated.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

Now that the invention has been described,

What is claimed is:

1. A method for anisotropically etching a feature in a substrate comprising the steps of:
   subjecting the substrate to an alternating cyclical process within a plasma chamber, said alternating cyclical process having an etching step and a deposition step;
   introducing into said plasma chamber a first process gas for depositing a film onto the substrate during the deposition step of said alternating cyclical process;
   introducing into said plasma chamber a second process gas for etching the substrate during the etching step of said alternating cyclical process;
   regulating pressure of said plasma chamber by setting a throttle valve at a predetermined position set point for a period of about 0.05 to 0.5 seconds during at least one step of said alternating cyclical process;
   igniting a plasma for a recipe period of time for the deposition step of said alternating cyclical process and the etching step of said alternating cyclical process;
   enabling a closed loop pressure control algorithm after said predetermined period of time expires; and
   controlling pressure at a recipe specified pressure set point in said plasma chamber through a closed loop pressure control for a period that lasts the remaining time of the step.

2. The method of claim 1 wherein the predetermined position set point is set to a throttle valve position of a preceding like step of said alternating cyclical process.

3. The method of claim 1 wherein the predetermined position set point is derived from a throttle valve position of a preceding like step of said alternating cyclical process.

4. The method of claim 3 wherein the predetermined position set point is derived from an average throttle valve position of a plurality of preceding like steps of said alternating cyclical process.

5. The method of claim 3 wherein the predetermined position set point is derived from prior calibration experiments.

6. The method of claim 3 wherein the predetermined position set point is adjusted by an offset from said throttle valve position of said preceding like step of said alternating cyclical process.

7. The method of claim 6 wherein the offset is about 0.5 to 2 change in position from said throttle valve position of said preceding like step of said alternating cyclical process.

8. The method of claim 1 wherein the predetermined position set point changes using a predefined function for the duration of said predetermined period of time.

9. The method of claim 1 wherein the predetermined position set point is modified based on pressure performance of a preceding like step of said alternating cyclical process.

10. A method for anisotropically etching a feature in a substrate comprising the steps of:
  subjecting the substrate to an alternating cyclical process within a plasma chamber, said alternating cyclical process having an etching step and a deposition step;
  introducing into said plasma chamber a first process gas for depositing a film onto the substrate during the deposition step of said alternating cyclical process;
  introducing into said plasma chamber a second process gas for etching the substrate during the etching step of said alternating cyclical process;
  regulating pressure of said plasma chamber by setting a throttle valve at a predetermined position set point for a predetermined period of time during at least one step of said alternating cyclical process, said predetermined position set point is modified based on pressure performance of a preceding like step of said alternating cyclical process, said modification to the predetermined position set point is based on minimizing time to reach said recipe specified pressure set point;
  igniting a plasma for a recipe period of time for the deposition step of said alternating cyclical process and the etching step of said alternating cyclical process;
  enabling a closed loop pressure control algorithm after said predetermined period of time expires; and
  controlling pressure at a recipe specified pressure set point in said plasma chamber through a closed loop pressure control for a period that lasts the remaining time of the step.

11. A method for anisotropically etching a feature in a substrate comprising the steps of:
  subjecting the substrate to an alternating cyclical process within a plasma chamber, said alternating cyclical process having an etching step and a deposition step;
  introducing into said plasma chamber a first process gas for depositing a film onto the substrate during the deposition step of said alternating cyclical process;
  introducing into said plasma chamber a second process gas for etching the substrate during the etching step of said alternating cyclical process;
  regulating pressure of said plasma chamber by setting a throttle valve at a predetermined position set point for a predetermined period of time during at least one step of said alternating cyclical process, said predetermined position set point is modified based on pressure performance of a preceding like step of said alternating cyclical process, said modification to the predetermined position set point is based on minimizing deviation from said recipe specified pressure set point;
  igniting a plasma for a recipe period of time for the deposition step of said alternating cyclical process and the etching step of said alternating cyclical process;
  enabling a closed loop pressure control algorithm after said predetermined period of time expires; and
  controlling pressure at a recipe specified pressure set point in said plasma chamber through a closed loop pressure control for a period that lasts the remaining time of the step.

12. A method for anisotropically etching a feature in a substrate comprising the steps of:
  subjecting the substrate to an alternating cyclical process within a plasma chamber, said alternating cyclical process having an etching step and a deposition step;
  introducing into said plasma chamber a first process gas for depositing a film onto the substrate during the deposition step of said alternating cyclical process;
  introducing into said plasma chamber a second process gas for etching the substrate during the etching step of said alternating cyclical process;
  regulating pressure of said plasma chamber by setting a throttle valve at a predetermined position set point for a predetermined period of time during at least one step of said alternating cyclical process, said predetermined period of time is modified based on pressure performance of a preceding like step of said alternating cyclical process;
  igniting a plasma for a recipe period of time for the deposition step of said alternating cyclical process and the etching step of said alternating cyclical process;
  enabling a closed loop pressure control algorithm after said predetermined period of time expires; and
  controlling pressure at a recipe specified pressure set point in said plasma chamber through a closed loop pressure control for a period that lasts the remaining time of the step.

13. The method of claim 12 wherein the modification to the predetermined period of time is based on minimizing time to reach said recipe specified pressure set point.

14. The method of claim 12 wherein the modification to the predetermined period of time is based on minimizing deviation from said recipe specified pressure set point.

15. The method of claim 1 wherein said first process gas is octofluorocyclobutane.

16. The method of claim 1 wherein said second process gas is sulfur hexafluoride.

17. A method of pressure control in a time division multiplex process comprising the steps of:
  regulating a process pressure in a vacuum chamber in at least one step of the time division multiplex process by setting a throttle valve at a predetermined position set point for a period of about 0.05 to 0.5 seconds;
  introducing into said vacuum chamber at least one process gas;
  enabling a closed loop pressure control algorithm after said predetermined period of time expires; and
  controlling pressure at a recipe specified pressure set point through a closed loop pressure control for a period that lasts the remaining time of said step of the time division multiplex process.

18. The method of claim 17 wherein the predetermined position set point is set to a throttle valve position of a preceding like step of said time division multiplex process.

19. The method of claim 17 wherein the predetermined position set point is derived from a throttle valve position of a preceding like step of said time division multiplex process.

20. The method of claim 19 wherein the predetermined position set point is derived from an average throttle valve position of a plurality of preceding like steps of said time division multiplex process.

21. The method of claim 19 wherein the predetermined position set point is derived from prior calibration experiments.

22. The method of claim 19 wherein the predetermined position set point is adjusted by an offset from said throttle valve position of said preceding like step of the time division multiplex process.

23. The method of claim 22 wherein the offset is about 0.5 to 2 change in position from said throttle valve position of said preceding like step of the time division multiplex process.

24. The method of claim 17 wherein the predetermined position set point changes using a predefined function for the duration of said predetermined period of time.

25. The method of claim 17 wherein the predetermined position set point is modified based on pressure performance of a preceding like step of the time division multiplex process.

26. A method of pressure control in a time division multiplex process comprising the steps of:
regulating a process pressure in a vacuum chamber in at least one step of the time division multiplex process by setting a throttle valve at a predetermined position set point for a predetermined period of time, said predetermined position set point is modified based on pressure performance of a preceding like step of the time division multiplex process, said modification to the predetermined position set point is based on minimizing time to reach said recipe specified pressure set point;
introducing into said vacuum chamber at least one process gas;
enabling a closed loop pressure control algorithm after said predetermined period of time expires; and
controlling pressure at a recipe specified pressure set point through a closed loop pressure control for a period that lasts the remaining time of said step of the time division multiplex process.

27. A method of pressure control in a time division multiplex process comprising the steps of:
regulating a process pressure in a vacuum chamber in at least one step of the time division multiplex process by setting a throttle valve at a predetermined position set point for a predetermined period of time, said predetermined position set point is modified based on pressure performance of a preceding like step of the time division multiplex process, said modification to the predetermined position set point is based on minimizing deviation from said recipe specified pressure set point;
introducing into said vacuum chamber at least one process gas;
enabling a closed loop pressure control algorithm after said predetermined period of time expires; and
controlling pressure at a recipe specified pressure set point through a closed loop pressure control for a period that lasts the remaining time of said step of the time division multiplex process.

28. A method of pressure control in a time division multiplex process comprising the steps of:
regulating a process pressure in a vacuum chamber in at least one step of the time division multiplex process by setting a throttle valve at a predetermined position set point for a predetermined period of time, said predetermined period of time is modified based on pressure performance of a preceding like step of the time division multiplex process;
introducing into said vacuum chamber at least one process gas;
enabling a closed loop pressure control algorithm after said predetermined period of time expires; and
controlling pressure at a recipe specified pressure set point through a closed loop pressure control for a period that lasts the remaining time of said step of the time division multiplex process.

29. The method of claim 28 wherein the modification to the predetermined period of time is based on minimizing time to reach said recipe specified pressure set point.

30. The method of claim 28 wherein the modification to the predetermined period of time is based on minimizing deviation from said recipe specified pressure set point.

31. A method for controlling pressure in a vacuum chamber, the method comprising the steps of:
regulating a process pressure in the vacuum chamber by setting a throttle valve at a predetermined position set point for a period of 0.05 to 0.5 seconds;
introducing into said vacuum chamber a gas;
enabling a closed loop pressure control algorithm after said predetermined period of time expires; and
controlling pressure at a recipe specified pressure set point in said vacuum chamber through a closed loop pressure control.

* * * * *